United States Patent [19]

ElHamamsy et al.

[11] Patent Number: 4,990,989

[45] Date of Patent: * Feb. 5, 1991

[54] RESTRICTED CONTACT PLANAR PHOTODIODE

[75] Inventors: Mahmoud A. ElHamamsy, New York, N.Y.; Stephen R. Forrest, Torrance, Calif.; John R. Zuber, Piscataway, N.J.

[73] Assignee: AT&T Bell Laboratories, Murray Hill, N.J.

[ * ] Notice: The portion of the term of this patent subsequent to Jan. 16, 2007 has been disclaimed.

[21] Appl. No.: 464,505

[22] Filed: Jan. 12, 1990

Related U.S. Application Data

[63] Continuation-in-part of Ser. No. 767,613, Aug. 20, 1985, Pat. No. 4,894,703, which is a continuation-in-part of Ser. No. 359,988, Mar. 19, 1982, abandoned.

[51] Int. Cl.$^5$ .............................................. H01L 27/14
[52] U.S. Cl. ....................................... 357/30; 357/16; 357/54; 357/68
[58] Field of Search .......................... 357/30, 16, 54, 68

[56] References Cited

U.S. PATENT DOCUMENTS

| | | |
|---|---|---|
| 3,287,612 | 11/1966 | Lepselter . |
| 3,943,621 | 3/1976 | Hartman . |
| 4,019,199 | 4/1977 | Chamberlain et al. ............... 357/39 |
| 4,062,707 | 12/1977 | Mochizuki et al. .................... 357/54 |
| 4,072,541 | 2/1978 | Meulenberg et al. .................. 357/58 |
| 4,110,778 | 8/1978 | Eden et al. . |

OTHER PUBLICATIONS

*Electronics*, p. 77, Sep. 4, 69.
Forrest, S. R., "Low Dark Current High Efficiency Planar InGaAs/InP P-rN Photodiodes", *IEEE Elec. Dev. Letrs.*, vol. EDL-2 #11, pp. 283–285, Nov. 81.
"$Ga_{0.47}In_{0.53}As$: A Ternary Semiconductor for Photodetector Applications"; *IEEE Journal of Quantum Electronics*, vol. QE-16, (1980), pp. 709–720, T. P. Pearsall.
"$In_{0.53}Ga_{0.47}As$ p-i-n Photodiodes For Long-Wavelength Fiber–Optic Systems", *Electronics Letters*, vol. 15, No. 22, (1979); pp. 713–715, R. F. Leheny et al.
"Small Area InGaAs/InP p-i-n Photodiodes: Fabrication, Characteristics and Performance of Devices in 274 Mb/s and 45 Mb/s, Lightwave Receivers at 1:31 μm Wavelength", *Electronics Letters*, vol. 16, No. 4, pp. 155–156 (Feb. 14, 1980), T. P. Lee et al.
"Zn-diffused $In_{0.53}Ga_{0.47}As$/InP avalanche photodetector", *Applied Physics Letters*, vol. 35, No. 6, (Sep. 15, 1979), pp. 466–468, Y. Matsushima et al.
"Planar Type Vapor–Phase Epitaxial $In_{0.53}Ga_{0.47}As$ Photodiode", *IEEE Electron Device Letters*, EDL-1, No. 4 (Apr. 1980), pp. 55–57, N. Susa et al.
"Planar Photodiodes Made From Vapour–Phase Epitaxial $In_xGa_{1-x}As$", *Electronics Letters*, vol. 15, No. 8, pp. 238–240, (Apr. 1979), N. Susa et al.
"InP/InGaAs Heterojunction Phototransistors", *IEEE Journal of Quantum Electronics*, vol. QE-17, No. 2 (Feb. 1981); pp. 264–269, J. C. Campbell et al.
*Electronics* publication, Aug. 4, 1969, vol. 42, No. 6.
"InGaAs Avalanche Photodiode With InP p-n Junction", *Electronics Letters*, vol. 16, No. 5, pp. 163–165, Feb. 1980, H. Kanbe et al.
"Low Dark-Current, High-Efficiency Planar $In_{0.53}Ga_{0.47}$ As/InP p-i-n Photodioddes", *Electron Device Letters*, vol. EDL-2, No. 11, Nov. 1981, pp. 283–285, S. R. Forrest et al.

*Primary Examiner*—Andrew J. James
*Assistant Examiner*—Stephen D. Meier
*Attorney, Agent, or Firm*—Michael J. Urbano

[57] ABSTRACT

An InGaAs photodiode is described in which a double layer of silicon nitride on the front surface serves several functions; both layers passivate the surface; an opening in the lower layer provides a diffusion mask for forming the p-n junction; and a narrower opening in the upper silicon nitride layer provides a deposition mask for forming a restricted area contact. In order to reduce strain near the junction, and hence reduce leakage currents and enhance reliability, the contact geometry has a narrow pedestal portion which contacts the surface in a zone remote from the junction edges and has a wider cap portion which is formed on the pedestal portion to seal the surface from the introduction of contaminants. The photodiode may be back-illuminated or front-illuminated.

6 Claims, 1 Drawing Sheet

RESTRICTED CONTACT PLANAR PHOTODIODE

CROSS REFERENCE TO RELATED APPLICATION

This application is a continuation-in-part of our co-pending application Ser. No. 767,613 filed on Aug. 20, 1985, now U.S. Pat. No. 4,894,703 which in turn, is a continuation-in-part of application Ser. No. 359,988, filed Mar. 19, 1982, now abandoned.

BACKGROUND OF THE INVENTION

This invention related to detectors of optical radiation (i.e., lightwaves) and, more particularly, to semiconductor photodiodes.

The recent special issue of the *Western Electric Engineer*, Vol. XXIV, No. 1, Winter 1980, is a graphic illustration of the burgeoning interest in lightwave communication systems, especially fiber optic systems. The rapid growth of these systems has engendered commensurate activity in optical sources and detectors, primarily GaAs-AlGaAs laser diodes and LEDs in conjunction with Si APDs and p-i-n diodes for present applications at relatively short wavelengths (e.g., 0.80-0.90 μm), and InP-InGaAsP laser diodes and InGaAs photodiodes for future systems at longer wavelengths (e.g., 1.1-1.6 μm).

In these systems, the receiver sensitivity is limited by the dark current of the p-i-n photodiode, especially at low bit rates. For example, at bit rates less than about 12 MHz, the room temperature photodiode dark current should be less than about 5 nA at the operating voltage so that it will remain sufficiently low to avoid degrading the sensitivity of a GaAs-FET receiver at elevated operating temperatures.

Because of their relatively low dark current densities and room temperature bandgap of 0.75 eV, $In_{0.53}Ga_{0.47}As$ p-i-n photodiodes are particularly well suited as optical detectors in the 1.0-1.6 μm range. Recent reports in the technical literature provide ample evidence of the intensity of activity directed toward the fabrication of practical $In_{0.53}Ga_{0.47}As$ p-i-n photodiodes. For example, FIG. 1 shows a mesa-type $In_{0.53}Ga_{0.47}As$ p-i-n photodiode in which the p-n junction is formed at the interface between p-type and n-type InGaAs epitaxial layers, and the mesa is formed by standard etching down to the InP substrate. FIG. 1 is representative of devices reported by T. P. Pearsall, *IEEE Journal of Quantum Electronics*, Vol. QE-16, p. 709, (1980); R. F. Leheny et al, *Electronics Letters*, Vol. 15, p. 713, (1979); T. P. Lee et al, *Electronics Letters*, Vol. 16, p. 155, (1980); and Y. Matsushima, *Applied Physics Letters*, Vol. 35, p. 466, (1979). Although a few of these photodiodes from a typical wafer may have relatively low dark currents ($\leq 5$ nA), they more typically have dark currents of ~10 nA. In addition, they have not been adequately passivated, making them extremely sensitive to humidity, oxygen and other atmospheric conditions, and their reliability is relatively poor.

On the other hand, planar p-i-n photodetectors, as shown in FIG. 2, are more amenable to passivation and reproducible fabrication. The planar structure has only one passivating silicon nitride layer which also serves as a mask for Zn-diffusion for forming the p-n junction. Such devices, even though easier to fabricate than mesa-type structures, have typical dark current values of tens of nanoamperes and questionable reliability. FIG. 2 is representative of photodiodes reported by N. Susa et al, *IEEE Electron Device Letters*, EDL-1, p. 55, (1980); N. Susa et al, *Electronics Letters*, Vol. 15, p. 238, (1979); and S. R. Forrest et al, *IEEE Electron Device Letters*, Vol. EDL-2, p. 283, (1981).

SUMMARY OF THE INVENTION

We have found that p-i-n planar, Group III-V compound (e.g., InGaAs) photodiodes can be fabricated reproducibly to have very low room temperature dark currents and very high reliability. These desirable characteristics are realized by employing a composite dielectric layer in conjunction with a unique contact configuration. The composite layers preferably comprise first and second silicon nitride layers. The first silicon nitride layer is deposited on a major surface of a semiconductor body to partially passivate it and to serve as a mask for introducing a dopant into the semiconductor. The semiconductor body includes a zone of material which is absorptive at the wavelength of the light waves to be detected. A first, typically circular, window is opened in this first layer to enable a dopant to be introduced into the semiconductor body to form a p-n junction therein. The second silicon nitride layer is deposited over the first to seal cracks which tend to form in the first layer and to serve as a mask to delineate an electrical contact. A second, typically circular, window is opened in the second layer so as to lie within the first window. Hence, it has a narrower diameter than the first window. A pedestal portion of the contact is formed in the second window so that the contact edges are remote enough from the junction edges to reduce strain in the high field regions of the junction near the surface. A cap portion of the contact is formed on the pedestal portion so as to seal the vertical interface between the pedestal portion and the second nitride layer.

The different thermal expansion coefficients of the first silicon nitride layer and the underlying semiconductor tend to produce cracks in the first layer. If these are left unsealed prior to subsequent metalization steps to form the contacts, the cracks, which often intersect the p-n junction, would allow metal to short circuit the junction, thereby increasing dark current. Other contaminants, such as water vapor, could likewise enter a crack and short circuit the junction. The second silicon nitride layer, however, serves to seal the cracks before metal or contaminants can produce such deleterious effects.

We have demonstrated the efficacy of this structure for $In_{0.53}Ga_{0.47}As$ planar photodiodes grown by LPE on n-InP substrates. These photodiodes exhibited room temperature dark currents of about 5 nA at a reverse bias of 10 V, low capacitance, high speed, and very high reliability.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

Figure 1:
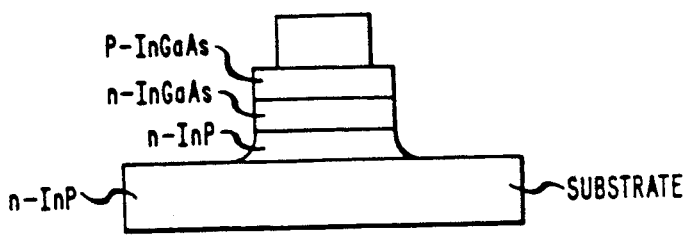
FIG. 1 shows an InGaAs mesa photodiode representative of the prior art.
Figure 2:
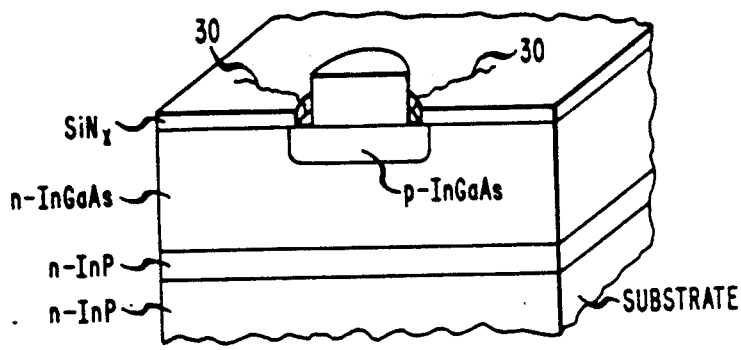
FIG. 2 shows an InGaAs planar photodiode representative of the prior art.

In order to reduce the dark current of prior art InGaAs planar photodiode shown in FIG. 2, we first directed our attention to improving the passivation of the n-InGaAs layer. One of the principal problems are the cracks 30 which form in the silicon nitride layer as a result of the different thermal expansion coefficients of silicon nitride and InGaAs. These cracks often intersect the p-n junction at the InGaAs top surface. If contaminants (e.g., metal from metalization steps, or water vapor from the atmosphere) enter the cracks, the p-n junction can be short circuited, resulting in increased dark current. We found that careful cleaning procedures and the use of dual silicon nitride layers reduced the room temperature dark current by a factor of nearly 3 to about 25 nA at 10 V and, in addition, improved the device reliability. The second silicon nitride layer, which overlays the first, seals the cracks and prevents contamination from reaching the junction. Nevertheless, the dark current was still too high, and reliability was inadequate for many important applications, such as the p-i-n photodiode/GaAs-FET receiver mentioned earlier.

Figure 3:
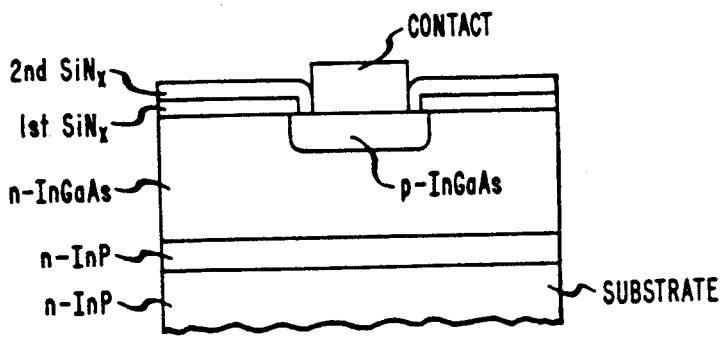
FIG. 3 shows a planar photodiode useful in describing the evolution of our invention; and, FIG. 4 shows a planar photodiode in accordance with an illustrative embodiment of our invention.

Upon further investigation we found two additional significant sources of dark current and/or low reliability in the planar photodiodes. First, as shown in FIG. 3, the vertical interface between the p-electrical contact and the second silicon nitride layer, as well as the horizontal interface between the second silicon nitride layer and the semiconductor, may not be perfect seals and therefore allow contaminants to migrate along the semiconductor surface to a crack in the first silicon nitride layer. This problem is exacerbated in the prior art photodiode of FIG. 2 where only a single silicon nitride layer is used, and an actual gap can exist between the contact and silicon nitride layer. Contaminants in the gap are not per se a problem because under reverse bias this undepleted region of semiconductor experiences essentially zero electric field. Thus, in the absence of cracks in the silicon nitride, the contaminants on the surface would be essentially immobile and would not migrate to the p-n junction. In practice, a similar gap is created in the photodiode of FIG. 3 because it is extremely difficult to align the metal contact deposition mask to the opening in the second silicon nitride layer. Any lack of concentricity between the openings will result in an undesired gap around portions of the periphery. Second, in both FIG. 2 and FIG. 3 the vertical edge of the p-contact is very close (typically a few $\mu$m) to the edge of the p-n junction at the surface, and we have found that this configuration contributes to additional dark current.

Figure 4:
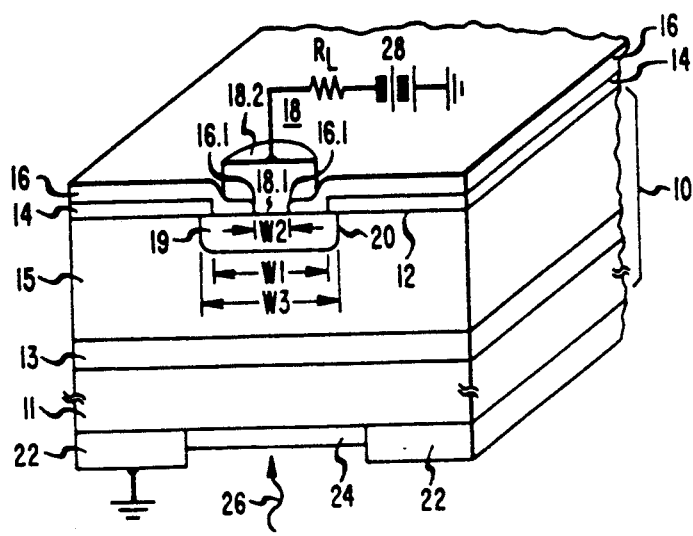

In accordance with our invention, therefore, a photodiode with reduced dark current, low capacitance, high speed, and improved reliability comprises, as shown in FIG. 4, a Group III-V compound semiconductor body 10 having a major surface 12 on which are deposited a first silicon nitride layer 14, a second silicon nitride layer 16, and an electrical contact 18. Typically, body 10 includes a transparent substrate 11, a transparent epitaxial buffer layer 13, and a light-absorbing epitaxial layer 15. The first layer 14 has a first, typically circular, window W1 therein and serves both to partially passivate surface 12 and to mask the introduction (e.g., via diffusion) of dopants, thereby changing the conductivity type of zone 19 and defining the width W3 of p-n junction 20. Due to lateral diffusion of the dopant the width W3 of the junction is slightly larger than the window width W1. Second layer 16 is deposited over first layer 14, and a second, typically circular, window W2 is opened therein so that windows W1 and W2 overlap one another but preferably so that window W2 is centered within window W1. Layer 16 serves to further passivate surface 12, as discussed above, and to mask the deposition (e.g., evaporation) of an ohmic electrical contact 18, thereby defining the width W2 of the bottom of the pedestal portion 18.1 of the contact. Although contact 18 is depicted as being symmetrical for purposes of illustration, it can also take on asymmetrical configurations.

In a back-illuminated embodiment an annular contact 22 is formed on the bottom of body 10 (e.g., on substrate 11), and an anti-reflection (AR) coating 24 is formed in the annulus. Lightwaves 26 to be detected are directed through AR coating 24 and transparent layers 11 and 13 into light-absorbing layer 15. This absorption generates hole-electron pairs which are swept out of layer 15 by a reverse bias voltage applied between contacts 18 and 22 by a source illustratively depicted as a battery 28. The electron-hole pairs so collected produce a photocurrent which does useful work in a load $R_L$. Alternatively, the advantages and features of the invention can be realized in a front illuminated embodiment using contact designs well-known in the art to permit light to enter light-absorbing layer 15 through the top surface of the photodiode.

The p-i-n configuration is realized by making the light-absorbing layer 15 lightly doped n-type (e.g., $\sim 5 \times 10^{15}$ cm$^3$) so that the p-type zone 19, n-type layer 15 and n-type layer 13 actually form a p-n$^-$-n$^+$ junction. Maximum light-absorption efficiency is obtained by adjusting the doping and thickness of layer 15 such that this layer is fully depleted at normal diode operating voltages.

Several features of our invention contribute singly and in combination with one another to reduce dark current and enhance reliability. First, and most importantly, the windows in the silicon nitride layers are mutually adapted so that the edges of the pedestal portion 18.1 of contact 18 are sufficiently remote from the edges of the junction 20 which intersect surface 12, thereby reducing strain and cracks in the high field region of the junction. To this end, the ratio of W1/W2 is preferably not less than about 3/1. Second, the contact 18 has a cap portion 18.2 which overlaps the vertical interface 16.1 between silicon nitride layer 16 and pedestal portion 18.1, thereby sealing out potentially deleterious contaminants. Third, the double dielectric layer provides better passivation than a single layer (even if the single layer is of the same thickness as the composite double layer); that is, the second silicon nitride layer 16 seals cracks in the first silicon nitride layer 14 which also prevents contaminants from shorting the p-n junction at the semiconductor surface.

EXAMPLE

The following example describes the fabrication and operation of an In$_{0.53}$Ga$_{0.47}$As back illuminated p-i-n (actually p-n$^-$-n$^+$) photodiode in accordance with an illustrative embodiment of our invention. (Actually a plurality of these photodiodes are fabricated on a wafer, but the singular will be used to describe one such device in the interests of clarity and simplicity). Unless otherwise indicated, materials, dimensions and other parameters are provided by way of illustration only and are not intended to be limitations on the scope of the invention.

With reference to FIG. 4, photodiode 10 comprised a (100)-oriented n-InP substrate 11 doped with sulphur to $\sim 10^{18}$ cm$^{-3}$ and two layers 13 and 15 grown thereon by liquid phase epitaxy: an unintentionally doped n-InP buffer layer 13 and an unintentionally doped n-In$_{0.53}$Ga$_{0.47}$As layer 15. The latter had a carrier concentration of about $7-9\times 10^{15}$ cm$^{-3}$. Diodes were also fabricated on tin-doped InP substrates.

Zone 19 of p-In$_{0.53}$Ga$_{0.47}$As and p-n junction 20 were formed by diffusion of Zn through window W1 in a silicon nitride layer 14. Prior to the deposition of the layer 14 the surface 12 of the wafer was etched in a dilute 1:1 aqueous HF solution for 4 minutes, then in a 0.5% solution of bromine in methanol for 10 seconds, followed by rinsing in methanol and deionized water. The silicon nitride layer 14 (about 1000 Angstroms thick) was deposited immediately following the surface preparation by reacting silane and ammonia in a commercial reactor. The substrate temperature during deposition was 350 degrees C. To form the p-n junction 20, Zn was diffused at 550 degrees C. through circular window W1, which was 75 μm in diameter, into the In$_{0.53}$Ga$_{0.47}$As layer 15 to a depth of about 2 μm. The window was photolithographically opened in layer 14 using standard techniques known in the art. The wafer was subsequently cleaned with pure organic solvents and a dilute solution of sulfuric acid and hydrogen peroxide.

To further passivate the device a second layer 16 of silicon nitride (about 1000 Angstroms thick) was plasma deposited on the first layer 14 using the same deposition parameters as for the first layer. To provide metal contact to the p-type zone 19, a circular window of diameter W2, centered in the window W1, was photolithographically etched in the layer 16. The size of the window W2 relative to the window W1 (i.e., actually junction W3) was found to be important for the achievement of low dark currents. In particular, it was found that the ratio W1/W2 should not be less than about 3/1. For W1=75 μm, W2=25 μm or less gave very low dark current devices and a tight distribution of dark currents across the wafer as discussed hereinafter. Furthermore, these results were reproducible from wafer to wafer. Metal contact to the p-In$_{0.53}$Ga$_{0.47}$As zone 20 was provided by evaporating a Au-Zn pedestal portion 18.1 in the window W2 in the layer 16, typically 18 μm in diameter (W1/W2=4.2). The diameter of the contact was then extended to about 63 μm in diameter by evaporating Ti-Au through a circular opening about 63 μm in diameter concentric with the 18 μm Au-Zn pedestal 18.1, thereby forming cap portion 18.2. Titanium was used because of its good adhesion to silicon nitride.

In addition, it is desirable that the diameter of the cap portion not exceed W3, in order to avoid increasing device capacitance and leakage current.

The back side of the substrate of the wafer was then processed. To increase the quantum efficiency of these back-illuminated devices, an AR coating 24 of silicon nitride was first plasma deposited by heating the wafer to 250 degrees C. and reacting silane and ammonia in a commercial reactor. The thickness of the AR coating was nominally 1800 Angstroms and its index of refraction 1.9. Using an infrared mask aligner ($\lambda > 1.7$ μm), an AR coated window 250 μm in diameter was defined on the n-side to be concentric with the contact 18. The silicon nitride on the substrate outside of the window was etched away, and a Au-Sn annular contact 22 was evaporated on the substrate to provide for the substrate contact. The contacts 18 and 22 were subsequently furnace alloyed by bringing the wafer to 420 degrees C. for 10 minutes in a forming gas atmosphere.

The room-temperature, reverse current-voltage characteristic of a typical planar p-i-n photodiode as described above was measured. The value of the dark current at 10 V reverse bias was 5 nA, which is adequate for use with GaAs/FET receivers at, for example, 12 Mb/s data rates. Dark current histograms were plotted for three wafers, B1, B2, and B3 showing median dark current values of 7.9 nA, 4 nA and 8.4 nA, respectively. About 60% of all devices on each wafer had less than 10 nA dark currents. The lowest dark current value at $-10$ V on any of these wafers was 2.9 nA, corresponding to a current density of $5.8\times 10^{-5}$ A/cm$^2$.

The capacitance-voltage (C-V) characteristics of these photodiodes were also investigated. For wafer B1 above, the capacitance at 10 V reverse bias was about 0.35 pF. The doping profile obtained from the C-V plot showed that the background doping density of this wafer was about $9.5\times 10^{15}$ cm$^{-3}$.

The quantum efficiency was determined by comparing the photocurrent of a detector with that of a calibrated In$_{0.53}$Ga$_{0.47}$As photodiode. The source of radiation was a 1.28 μm LED coupled through a 50 μm core fiber butted up against the photosensitive region of the detector. Quantum efficiency measurements on devices from wafer B1 gave values of 87%±2% corresponding to a typical responsivity of 0.90 A/W.

On all wafers which were tested the breakdown voltage, defined as the voltage at which the dark current was 10 μA, was found to be about 50 V. Furthermore, the breakdown voltage values were found to be tightly distributed around their mean. For example, the devices of wafer B3 had breakdown voltage values of (50±3)V. Under a forward biasing current of 10 mA, the dynamic resistance of the restricted contact photodiodes was found to be (8±1)Ω. The response time of the p-i-n photodetectors was also measured by using as a source an InGaAsP laser emitting at 1.3 μm. The rise time of a typical device was found to be less than 0.23 nsec at a bias of $-10$ V.

Photodiodes of this type are suitable for use in lightwave receivers with data rate capabilities of at least 1 Gb/sec. They may be used in lightwave receivers or as laser backface monitors in lightwave transmitters.

Similar photodiodes with larger active areas (W1=250 μm, W2=67.5 μm, W2/W1=4:1) have also been fabricated. When operated at a reverse bias of 5 V and terminated by a 50 ohm load, they exhibited a rise/fall times of less than 1 nsec and dark currents of typically 10 nA. Responsivity (electrical current out/light power in) was typically 0.80 A/W at 1.3 μm.

Preliminary data from reliability studies on our photodiodes under conditions of 85 degrees C. and 85% relative humidity showed that the median life of these devices is greater than 1700 hours, which suggests excellent reliability.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the top surface of the semiconductor body need not be InGaAs and, in fact, in order to further reduce dark current may be a wider bandgap material such as InGaAsP or InP as described by O. K. Kim in copending application Ser. No. 609,317 filed on May 11, 1984 and assigned to the assignee hereof, now U.S. Pat. No. 4,608,586 issued on Aug. 26, 1986.

We claim:

1. A two-terminal, planar photodiode comprising
a Group III-V compound semiconductor body having a first major surface and an opposite major surface,
a first silicon nitride single layer formed on said first surface, said first layer having a first opening therein for introducing a dopant into said body to form a p-n junction which intersects said surface at points recessed from the edge of said first opening.
a second silicon nitride layer formed so as to contact said first layer along its entire length, said second layer having a second opening which lies within said first opening,
a single electrical contact to said first surface, said contact including: a pedestal portion formed in said second opening so as to have an interface with said second layer and positioned remote from the points where said junction intersects said surface, and a cap portion overlapping said pedestal portion so as to seal said interface, said pedestal portion being positioned sufficiently remote from said points so as to reduce stress induced at said points, and
a second electrical contact to said opposite major surface,
at least one of said contacts being adapted to permit lightwaves to be detected to be incident on said body.

2. The photodiode of claim 1 wherein said single contact has a symmetric configuration.

3. The photodiode of claim 1 wherein said single contact has an asymmetric configuration.

4. The photodiode of claims 1, 2 or 3 wherein said single contact is adapted to permit said lightwaves to be incident on said body.

5. The photodiode of claims 1, 2 or 3 wherein said second contact is adapted to permit said lightwaves to be incident on said body.

6. The photodiode of claim 5 wherein said second contact is annular.

* * * * *